(12) United States Patent
Hung et al.

(10) Patent No.: US 6,263,470 B1
(45) Date of Patent: Jul. 17, 2001

(54) EFFICIENT LOOK-UP TABLE METHODS FOR REED-SOLOMON DECODING

(75) Inventors: Ching-Yu Hung, Plano, TX (US); Yaqi Cheng, Smyrna, GA (US); Tod D. Wolf, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/200,348

(22) Filed: Nov. 25, 1998

Related U.S. Application Data

(60) Provisional application No. 60/073,595, filed on Feb. 3, 1998.

(51) Int. Cl.[7] .................................................. H03M 13/00
(52) U.S. Cl. .......................... 714/784; 714/759; 714/785
(58) Field of Search ..................................... 714/755, 756, 714/758, 752, 761, 762, 763, 784, 785, 759, 757, 765; 708/492

(56) References Cited

U.S. PATENT DOCUMENTS 4,839,896 * 6/1989 Glover et al. ........................ 714/759
4,866,654 * 9/1989 Yamada ................................ 708/492

OTHER PUBLICATIONS

"Polynomial Codes Over Certain Finite Fields," Reed & Solomon, *Journal of the Society For Industrial and Applied Mathematics*, vol. 8 (SIAM, 06/60,), No. 2, pp. 300–304.

* cited by examiner

*Primary Examiner*—Emmanuel L. Moise
(74) *Attorney, Agent, or Firm*—J. Dennis Moore; W. James Brady, III; Frederick J. Telecky, Jr.

(57) ABSTRACT

A programmable logic device (130) as may be used in a communication system device such as a digital subscriber line modem (408) to perform Reed-Solomon decoding upon a received frame of digital values is disclosed. The programmable logic device (130) may be implemented as a DSP (130) or a general purpose microprocessor, for example. According to one disclosed embodiment of the invention, a group of look-up tables (60) are arranged, each look-up table (60) associated with one of the possible power values of a finite field, number up to twice the number of correctable errors. The contents of each entry (SYN) of the look-up tables (60) correspond to the finite field (e.g., Galois field) multiplication of a primitive element raised to an index power with a character of the finite field alphabet. Galois field multiplications (62) in syndrome accumulation may now be performed with a single table look-up operation. According to other disclosed embodiments of the invention, look-up tables (60, 160) are similarly arranged to contain the contents of finite field (e.g., Galois field) multiplication products for use in a Chien search procedure. In a single-thread version of the disclosed Chien search procedure, a subset of the same look-up tables (60) as used in syndrome accumulation may be utilized.

21 Claims, 7 Drawing Sheets

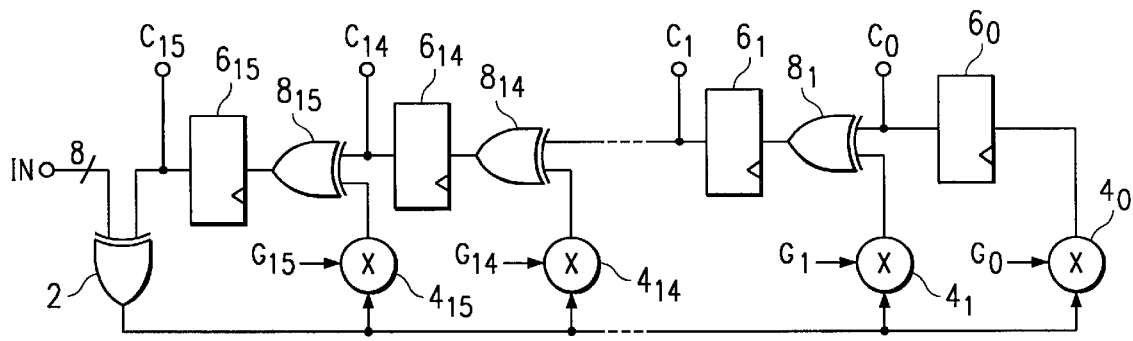
FIG. 1
(PRIOR ART)
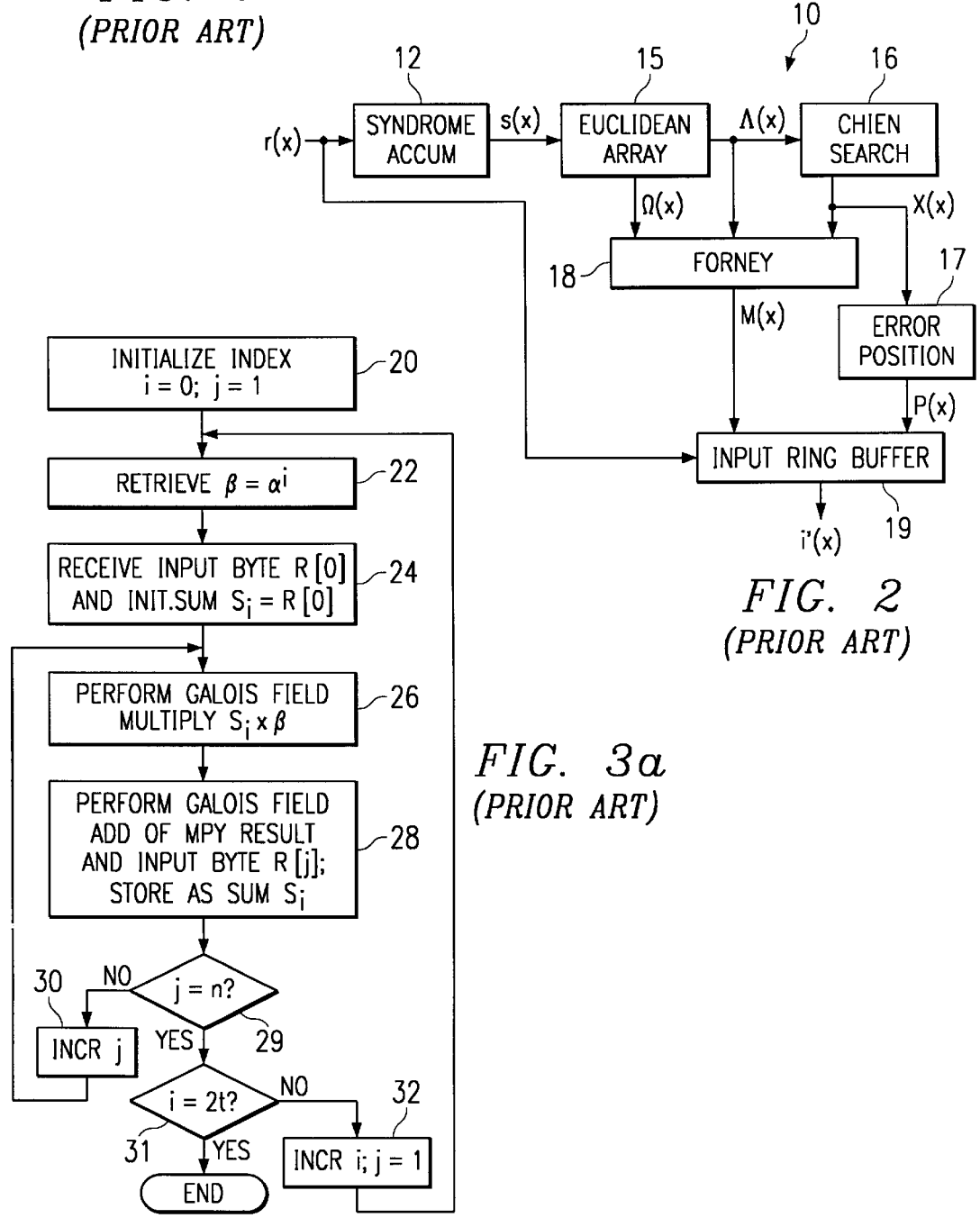
FIG. 2
(PRIOR ART)
FIG. 3a
(PRIOR ART)

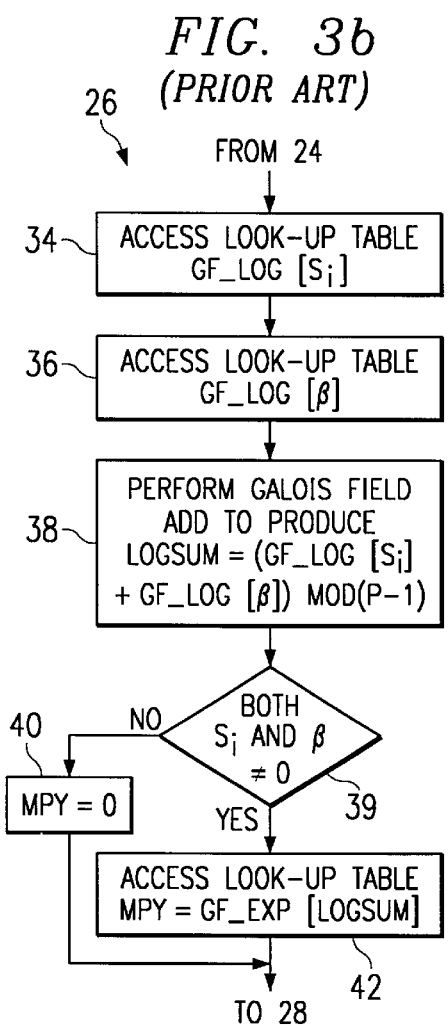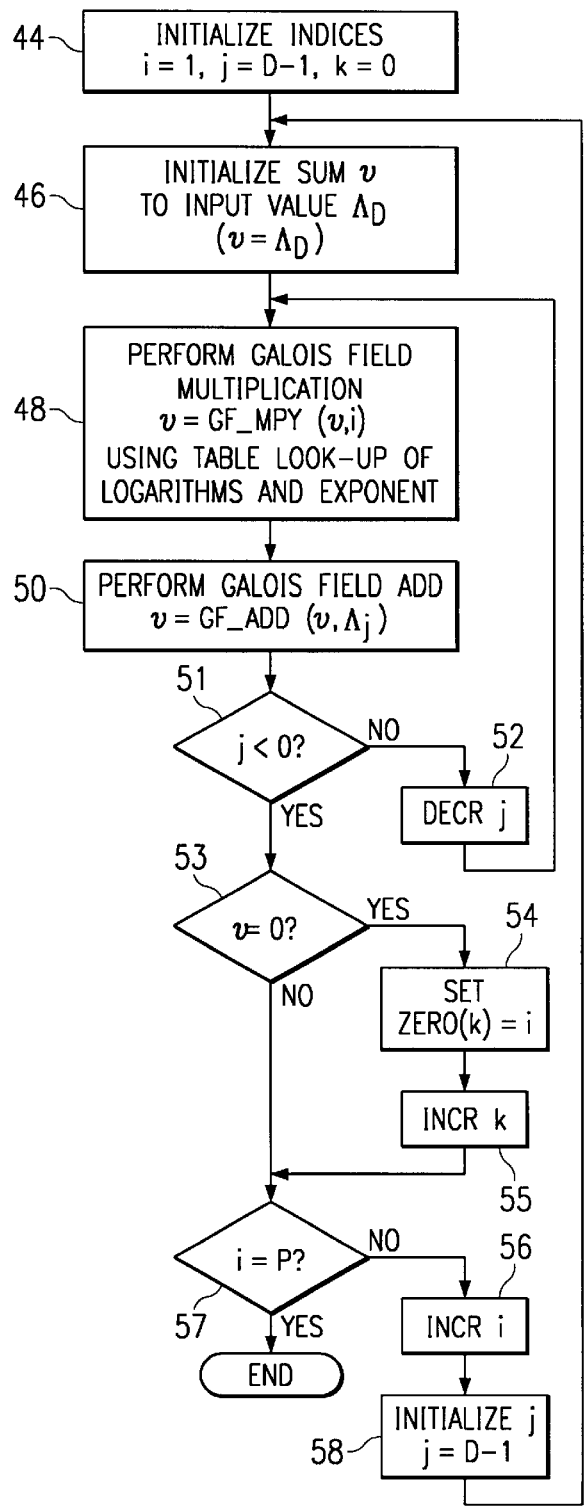

EFFICIENT LOOK-UP TABLE METHODS FOR REED-SOLOMON DECODING

CROSS-REFERENCE TO RELATED APPLICATIONS

This application claims the benefit, under 35 U.S.C. §119(e)(1), of U.S. Provisional Application No. 60/073,595, filed Feb. 3, 1998, which is incorporated herein by this reference.

STATEMENT REGARDING FEDERALLY SPONSORED RESEARCH OR DEVELOPMENT

Not applicable.

BACKGROUND OF THE INVENTION

This invention is in the field of data communication, and is more specifically directed to error correction methods in the receipt of such communications.

Recent advances in the electronics field have now made high-speed digital data communications prevalent in many types of applications and uses. Digital communication techniques are now used for communication of audio signals for telephony, with video telephony now becoming available in some locations. Digital communication among computers is also prevalent, particularly with the advent of the Internet; of course, computer-to-computer networking by way of dedicated connections (e.g., local-area networks) and also by way of dial-up connections has also become prevalent in recent years.

Of course, the quality of communications carried out in these ways depends upon the accuracy with which the received signals match the transmitted signals. Some types of communications, such as audio communications, can withstand bit loss to a relatively large degree. However, the communication of digital data, especially of executable programs, requires exact fidelity in order to be at all useful. Accordingly, various techniques for the detection and correction of errors in communicated digital bit streams have been developed. Indeed, error correction techniques have effectively enabled digital communications to be carried out over available communication facilities, such as existing telephone lines, despite the error rates inherent in high-frequency communication over these facilities.

Error correction may also be used in applications other than the communication of data and other signals over networks. For example, the retrieval of stored data by a computer from its own magnetic storage devices also typically utilizes error correction techniques to ensure exact fidelity of the retrieved data; such fidelity is, of course, essential in the reliable operation of the computer system from executable program code stored in its mass storage devices. Digital entertainment equipment, such as compact disc players, digital audio tape recorders and players, and the like also now typically utilize error correction techniques to provide high fidelity output.

An important class of error detection and error correction techniques is referred to as Reed-Solomon coding, and was originally described in Reed and Solomon, "Polynomial Codes over Certain Finite Fields", *J. Soc. for Industrial and Applied Mathematics,* Vol. 8 (SIAM, 1960), pp. 300–304. Reed-Solomon coding uses finite-field arithmetic, such as Galois field arithmetic, to map blocks of a communication into larger blocks. In effect, each coded block corresponds to an over-specified polynomial based upon the input block. Considering a message as made up of k m-bit elements, a polynomial of degree n−1 may be determined as having n coefficients; with n greater than k (i.e., the polynomial is overspecified), not all of the n coefficients need be valid in order to fully and accurately recover the message. According to Reed-Solomon coding, the number t of errors that may be corrected is determined by the relationship between n and k, according to $$t \leq \frac{n-k}{2}.$$

Reed-Solomon encoding is used to generate the encoded message in such a manner that, upon decoding of the received encoded message, the number and location of any errors in the received message may be determined. Conventional Reed-Solomon encoder and decoder functions are generally implemented, in microprocessor-based architectures, as dedicated hardware units that are not in the datapath of the central processing unit (CPU) of the system, as CPU functionality has not heretofore been extended to include these functions.

In this regard, FIG. 1 illustrates one example of an architecture for a conventional Reed-Solomon encoder, for the example where each symbol is eight bits, or one byte, in size (i.e., m=8), where Galois field arithmetic is used such that the size of the Galois field is $2^8$, and where the maximum codeword length is $2^8-1$, or 255 symbols. Of course, other architectures may be used to derive the encoded codeword for the same message and checksum parameters, or of course for other symbol sizes, checksum lengths, or maximum codeword lengths. In the example of FIG. 1, sixteen check symbols are generated for each codeword, and as such eight errors per codeword may be corrected. According to conventional Reed-Solomon encoding, the k message bytes in the codeword ($M_{k-1}$, $M_{k-2}$, ..., $M_0$) are used to generate the check symbols ($C_{15}$, $C_{14}$, ..., $C_0$). The check symbols C are the coefficients of a polynomial C(x)

$$C(x) = C_{15}x^{15} + C_{14}x^{14} + \ldots + C_0$$

which is the remainder of the division of a message polynomial M(x), having the message bytes as coefficients:

$$M(x) = M_{k-1}x^{K-1} + M_{k-2}x^{k-2} + \ldots + M_0$$

where the message polynomial M(x) is multiplied by the term $x^2 t$, and divided by a divisor referred to as generator polynomial G(x):

$$G(x) = (x-a^0)(x-a^1)(x-a^2) \ldots (x-a^{15}) = x^{16} + G_{15}x^{15} + G_{14}x^{14} + \ldots + G_0$$

where each value is a root of the binary primitive polynomial $x^8 + x^4 + x^3 + x^2 + 1$. The exemplary architecture of FIG. 1 includes sixteen eight-bit shift register latches $6_{15}$ through $6_0$, which will contain the remainder values from the polynomial division, and thus will present the checksum coefficients $C_{15}$ through $C_0$, respectively. An eight-bit exclusive-OR function $8_{15}$ through $8_1$ is provided between each pair of shift register latches 6 to effect Galois field addition, with XOR function $8_{15}$ located between latches $6_{15}$ and $6_{14}$, and so on. The feedback path produced by exclusive-OR function 2, which receives both the input symbol and the output of the last latch $6_{15}$, presents the quotient for each division step. This quotient is broadcast to sixteen constant Galois field multipliers $4_{15}$ through $4_0$, which multiply the quotient by respective ones of the coefficients $G_{15}$ through $G_0$. In operation, the first k symbols contain the message itself, and are output directly as the leading portion of the codeword. Each of these message symbols enters the encoder architecture of FIG. 1 on lines IN, and is applied to the division operation carried out by this encoder. Upon completion of the operations of the architecture of FIG. 1 upon these message bytes, the remainder values retained in shift register latches $6_{15}$ through $6_0$ correspond to the checksum symbols $C_{15}$ through $C_0$, and are appended to the encoded codeword after the k message symbols.

The encoded codewords are then communicated in a digital bitstream, after the appropriate formatting. For communications over telephone facilities, of course, the codewords may be communicated either digitally or converted to analog signals; digital network or intracomputer communications will, of course, maintain the codewords in their digital format. Regardless of the communications medium, errors may occur in the communicated signals, and will be reflected in the received bitstream as opposite binary states from those in the input bitstream, prior to the encoding process of FIG. 1. These errors are sought to be corrected in the decoding process, as will now be described in a general manner relative to FIG. 2.

An example of the decoding of Reed-Solomon encoded codewords, generated for example by the architecture of FIG. 1, is conventionally carried out in the manner now to be described relative to decoder 10 illustrated in FIG. 2. Decoder 10 receives an input bitstream of codeword symbols, which is considered, for a single codeword, as received polynomial r(x) in FIG. 2. Received polynomial r(x) is applied to syndrome accumulator 12, which generates a syndrome polynomial s(x) of the form:

$$s(x)=s_{i-1}x^{i-1}+s_{i-2}x^{i-2}+\ldots+s_1x+s_0$$

Syndrome polynomial s(x) is indicative of whether errors were introduced into the communicated signals over the communication facility. If s(x)=0, no errors were present, but if s(x) is non-zero, one or more errors are present in the codeword under analysis. Syndrome polynomial s(x), in the form of a sequence of coefficients, is then forwarded to Euclidean array function 15.

Euclidean array function 15 generates two polynomials $\Lambda(x)$ and $\Omega(x)$ based upon the syndrome polynomial s(x) received from syndrome accumulator 12. The degree v of polynomial $\Lambda(x)$ indicates the number of errors in the codeword, and is forwarded to Chien search function 16 for additional analysis. Polynomial $\Omega(x)$ is also generated by Euclidean array function 15, and is forwarded to Forney function 18 which uses polynomial $\Omega(x)$ to evaluate the error in the received bitstream r(x). The roots of error locator polynomial $\Lambda(x)$ are determined by Chien search function 16, and are expressed as zeroes polynomial X(x) from which Forney function 18 determines the error magnitude polynomial M(x). Chien search function 16 also forwards zeroes polynomial X(x) to error position circuit 17 which generates error position polynomial P(x) therefrom. Error magnitude polynomial M(x) and error position polynomial P(x) are forwarded to input ring buffer 19 as an indication of the magnitude and position, respectively, of the errored symbols in the bitstream r(x), which is also forwarded to input ring buffer 19. Input ring buffer 19 then generates the output bitstream i'(x) by effectively subtracting the designated error magnitude from bitstream r(x) at the identified positions of the error, so that output bitstream i'(x) faithfully represents input bitstream r(x).

The use of programmable devices such as microprocessors and digital signal processors (DSPs), such as the TMS320c6x family of DSPs manufactured and sold by Texas Instruments Incorporated, is generally favored in modern data processing and communications applications, making it is desirable to execute such operations as syndrome accumulation and Chien search in such a programmable DSP or microprocessor. However, it is cumbersome for conventional programmable logic devices to execute finite field arithmetic operations, such as the Galois field multiplications, logarithms, and other operations described hereinabove.

Referring now to FIGS. 3a and 3b, an example of a conventional syndrome accumulation software program, executable by a DSP or other programmable microprocessor, will now be described. This conventional syndrome accumulation method corresponds to syndrome accumulator 12 in the architecture of decoder 10 of FIG. 2, even though implemented by way of software rather than dedicated hardware. It has been observed, in connection with the present invention, that this conventional syndrome accumulation process typically occupies up to as much as half of the overall computational time involved in Reed-Solomon decoding.

The conventional syndrome accumulation process shown in FIG. 3a begins with process 20, in which the DSP initializes index i to 0 and index j to 1. Index i is an outer loop index, while index j is the index for an inner loop, as will become apparent from the following description. Following initialization process 20, the DSP executes process 22 to retrieve, from memory, a finite field character $\alpha^i$ of the particular alphabet used in the Reed-Solomon decoding process. In this specific example, Galois field operations are used in the decoding operation, as is conventional for Reed-Solomon decoding. In this first pass (index i=0), the DSP sets the value of variable $\beta$ to the first Galois field character $\alpha^0$ (i.e., $\beta$=1). Process 24 is then next performed, in which the first input byte R[0] in the received sequence is received, and a sum variable $s_i$ associated with index i is then initialized to the value of input byte R[0].

Control then passes to process 26, in which the DSP performs a Galois field multiplication of the current value of sum $s_i$ with the value of variable $\beta$. This Galois field multiplication and other Galois field arithmetic operations are defined over a finite field of characters (i.e., the Galois field "alphabet"), the size and members of which depend upon the symbol size used in the coding. The Galois field multiplication of process 26 requires a significant amount of computing resources, as will now be described relative to FIG. 3b which illustrates, in more detail, a typical conventional software implementation of process 26.

For purposes of computational efficiency, typical software approaches to Galois field multiplication involve the use of look-up tables in memory, particularly in cases where the memory requirements for such tables is relatively modest and where performance of the algorithm is a significant factor. In the conventional example of FIG. 3b, Galois field multiplication process 26 is performed by adding the logarithms of the multiplicands, as this approach, particularly in connection with finite field arithmetic, is much more efficiently implemented than would be an explicit multiplication. The base of the logarithm (and thus of the eventual exponentiation) can be any primitive element of the Galois field alphabet, for example $\alpha$=2. In the conventional example of FIG. 3b, process 26 begins with process 34, in which the DSP accesses a logarithmic look-up table to determine the Galois field logarithm of the value of sum $s_i$ at this time; similarly, process 36 accesses a look-up table (generally the same look-up table as used in process 34) to determine the Galois field logarithm of the value of variable β. Process 38 then performs a Galois field modulo (P−1) addition of the results of processes 34, 36, where P corresponds to the number of characters in the Galois field alphabet; for the example of eight-bit symbol sizes, 256 characters will be present in the corresponding Galois field alphabet (i.e., P=256). The result of addition process 38 is value LOGSUM. Following Galois field addition process 38, the current values of sum $s_i$ and character β are tested against zero in decision 39; if either is zero, process 40 sets the result MPY of the multiplication of process 26 to zero. If both of sum $s_i$ and character β are non-zero (decision 39 is YES), the result MPY of process 26 is established by applying the value LOGSUM to a Galois field exponential look-up table to return a Galois field exponential therefrom (inverting the logarithms determined in process 34, 36), producing result MPY as the product of sum $s_i$ and character β.

Control then returns to process 28, shown in FIG. 3*a*, in which a Galois field addition of the result MPY of process 26 with the current input byte R[j] corresponding to the current value of index j is performed. The result of the addition of process 28 is stored as the current value of sum $s_i$. Following process 28, the values of the indices i, j are tested against their corresponding limits n (the number of bytes in a message frame) and 2t (twice the number t of errors that may be corrected by the Reed-Solomon process). If index j is not yet equal to limit n (decision 29 is NO), index j is incremented in process 30 and control is passed to process 26 to repeat the Galois field multiplication and addition with the next input byte (process 28). Upon limit n being reached by index j (decision 29 is YES), the value of index i is tested against its limit 2t in decision 31. If index i does not yet equal limit 2t (decision 31 is NO), process 32 is performed to increment index i and to reset index j to 1, and control passes back to process 22 for retrieval of the next character $\alpha^i$, from which the process is repeated. Upon index i reaching its limit 2t (decision 31 is YES), the syndrome accumulation process is complete.

According to this conventional software approach to syndrome accumulation, three table look-up operations (i.e., processes 34, 36, 42) are required in each Galois field multiplication process 26. One can readily determine that, according to this conventional approach, 2nt instances of Galois field multiplication processes 26 and additions 28 are carried out, considering that index j varies from 1 to n−1 and that index i varies from 0 to t (and the zeroth value of $\alpha^i$ renders a trivial result). For the Reed-Solomon case where α=2, n=204 (bytes/frame), t=8 (eight errors correctable), and P=256 (256-character Galois field), 3,264 such multiplications and additions are performed for each syndrome accumulation calculation. While a Galois field addition may be implemented as a simple bit-wise exclusive OR, the Galois field multiplication dominates the computational time. For example, each of these Galois field multiplication operations, when implemented by way of look-up tables in a TMS320c6x DSP architecture, requires on the order of twelve machine cycles for execution. Considering the number of passes through the inner loop, these three table look-up operations per multiplication thus results in 6nt table look-up operations in total. The memory required to implement each of the logarithm and exponentiation tables is 256x8 bits, with three tables required (to permit the two processes 34, 36 to be done in parallel).

Alternatively, one could implement one large table to return a multiplication result directly from the two eight-bit inputs, reducing the number of machine cycles required for the multiplication from twelve to one, in the TMS320c6x DSP architecture. However, the size of this table would necessarily be $P^2 \times \lceil \log_2 P \rceil$ bits ($\lceil \ \rceil$ representing the ceiling function, where $\lceil x \rceil$ returns the smallest integer y such that $y \geq x$) or, in this example using Galois field 256 arithmetic, 65536 bytes. A look-up table of this size is prohibitively large for most implementations.

Similar computational time complexity is also present in connection with the Chien search process of Reed-Solomon decoding. As known in the art, Chien search involves an exhaustive search, over the entire Galois field (having P members) for zeros of a polynomial of degree D (the maximum value of which is the number t of correctable errors). A conventional approach to this search is carried out using Horner's algorithm for root determination, iterating sequentially over the possible zeros.

FIG. 4 is a flow diagram illustrating a conventional software approach to the Chien search process, as may be implemented in a program executed by a conventional DSP and using the iterated Horner's algorithm method. The operation of FIG. 4 corresponds to Chien search function 16 in decoder 10 of the architecture of FIG. 2. This Chien search software approach occupies approximately 30% of the computational time of the entire Reed-Solomon decoding process, in conventional applications.

This conventional Chien search software algorithm begins with process 44, in which outer loop index i (corresponding to the members of the Galois field alphabet) is initialized to 1, inner loop index j is initialized to the value D−1, where D corresponds to the degree of polynomial A from the Euclidean array process (as shown in FIG. 2), and where index k corresponding to the number of roots found is initialized to zero. Process 46 is then performed, beginning the outer loop of the algorithm, to set the sum υ to the highest degree term in the input polynomial Λ(x) from the Euclidean array, namely $\Lambda_D$.

The inner loop of this conventional Chien search operation is dominated by process 48, in which a Galois field multiplication of the current value of sum υ with index i (i.e., the corresponding Galois field alphabet member) is performed. This Galois field multiplication is performed by way of the addition of finite field logarithms of the multiplicands, followed by the exponentiation of the sum; as described above relative to FIG. 3*b*, such a Galois field multiplication involves three table look-up operations plus a Galois field addition. In this case, as described above, it is not feasible from a memory requirement standpoint to carry out the Galois field multiplication using a single table look-up operation.

As a result of process 48, a new value of sum υ is produced; process 50 then adds (in the Galois field) the next term $\Lambda_j$ of the input polynomial Λ(x) to the current value of sum υ to produce a new value of sum υ. Decision 51 determines if the inner loop is complete; if not, index j is decremented in process 52 and control passes back to process 48. Upon decision 51 determining that the inner loop is complete (decision 51 is YES), the value υ represents a complete evaluation of the input polynomial Λ(x), and is tested in decision 53 to determine if a root of the input polynomial Λ(x) has been found in association with the current Galois field character indicated by index i. If so (decision 53 is YES), a memory array location zero(k) is set to the current value of index i in process 54, and result index k is incremented in process 55. Following process 55, or if no root was found (decision 53 is NO), outer loop index i is tested in decision 57; if remaining passes are required (decision 57 is NO), index i is decremented in process 56, index j is re-initialized to D−1 in process 58, and control passes back to process 46. Upon decision 57 returning a YES result in response to index i=P (P being the number of characters in the Galois field alphabet), the Chien search process is complete.

As noted above, in this conventional Chien search process, the Galois field multiplication operation of process 48 dominates the computational time of the method, even when performed by way of table look-up operations. According to typical architectures, on the order of twelve machine cycles are required for such an operation. Of course, while this operation could be reduced to a single machine cycle by generation of a large Galois field multiplication look-up table, the memory cost of such a table is prohibitive.

By way of further background, because of this complexity and operational cost, custom hardware devices are often used in the realization of Reed-Solomon decoders, particularly for the syndrome accumulation and Chien search operations described above. Such custom hardware solutions are, of course, limited in their flexibility to operate upon encoded communications according to varied standards and techniques, and of course require the design effort and manufacturing lead time necessary for their production.

BRIEF SUMMARY OF THE INVENTION

It is therefore an object of the present invention to provide an efficient method of performing finite field multiplications in Reed-Solomon decoding processes such as syndrome accumulation and Chien search.

It is a further object of the present invention to provide such a method that may be readily implemented into a program of instructions executable by a digital signal processor or microprocessor.

It is a further object of the present invention to provide such a method in which the sizes of look-up tables in memory may remain reasonable.

Other objects and advantages of the present invention will be apparent to those of ordinary skill in the art having reference to the following specification together with its drawings.

The present invention may be implemented into a digital signal processor (DSP), microprocessor, or other programmable device that may be used in executing Reed-Solomon decoding upon an encoded input bitstream. In an initial process, the input bitstream is applied to a syndrome accumulation process, in which finite field multiplications are carried out by the execution of a sequence of instructions that includes, in place of the finite field multiplication, a table look-up to one of a plurality of look-up tables selected according to one of the operands, namely a selected power of a primitive element of the finite field. In the Chien search operation, the present invention is implemented by performing a table look-up to one of a plurality of look-up tables, again selected according to a selected power of a primitive element of the finite field.

BRIEF DESCRIPTION OF THE SEVERAL VIEWS OF THE DRAWING

FIG. 1 is an electrical diagram, in schematic form, of a conventional Reed-Solomon encoder architecture.

FIG. 2 is an electrical diagram, in block form, of a conventional Reed-Solomon decoder architecture.

FIGS. 3a and 3b are flow diagrams illustrating the operation of a syndrome accumulation method according to the prior art.

FIG. 4 is a flow diagram illustrating the operation of a Chien search method according to the prior art.

DETAILED DESCRIPTION OF THE INVENTION

As will become apparent from the following description, the present invention provides benefits in the implementation and use of Reed-Solomon decoding operations, particularly when such operations are implemented within and carried out by a programmable logic device, such as a digital signal processor (DSP), microprocessor, and the like. As such, the present invention may be used in connection with Reed-Solomon decoding in various applications, including data communications over telephone facilities such as carried out between modems, data communications over high-speed data networks, and even the communication of digital data within a single computer such as between disk storage and the central processing unit. It is therefore contemplated that the description of the preferred embodiment of the invention herein, including its implementation in connection with a digital subscriber line (DSL) modem, will be understood by those in the art as exemplary only, and that those artisans having reference to this specification will be readily able to implement the present invention in the Reed-Solomon decoding processes carried out in other applications.

According to the preferred embodiment of the present invention, a programmable logic device realized as an integrated circuit is used to embody and carry out the present invention. While the particular architecture of such an integrated circuit may vary from that described herein according to the preferred embodiment of the invention, it will of course be understood that many different types of architectures and programmable logic devices may benefit from the use of the present invention. As such, it is to be understood that the following description is provided by way of example only, and is not intended to limit the scope of the present invention as hereinafter claimed.

Figure 5:
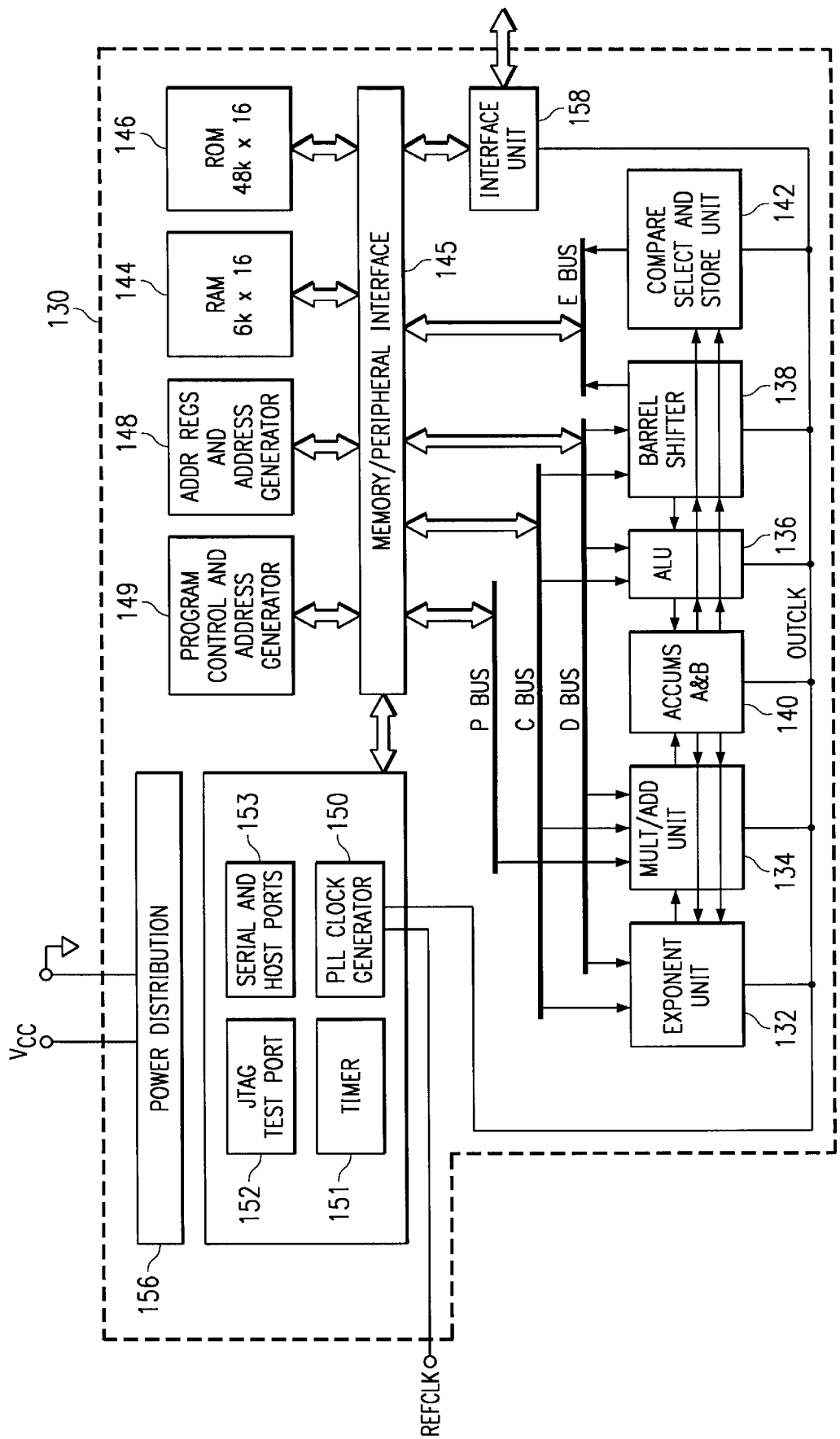
FIG. 5 is an electrical diagram, in block form, of a digital signal processor constructed according to the preferred embodiments of the invention.

An example of a programmable logic device, in the form of digital signal processor (DSP) integrated circuit 130, into which the preferred embodiment of the invention may be implemented is illustrated in FIG. 5. The architecture illustrated in FIG. 5 for DSP 130 is presented by way of example; this exemplary architecture corresponds generally to that of the TMS320c54 DSP available from Texas Instruments Incorporated. It will be understood by those of ordinary skill in the art, of course, that the present invention may be implemented into DSPs and general purpose microprocessors of other architectures, as well as integrated circuits of various functionality and architecture, including custom logic circuits and other VLSI and larger integrated circuits.

DSP 130 in this example is implemented by way of a modified Harvard architecture, and as such utilizes three separate data buses C, D, E that are in communication with multiple execution units including exponent unit 132, multiply/add unit 134, arithmetic logic unit (ALU) 136, barrel shifter 138. Accumulators 140 permit operation of multiply/add unit 134 in parallel with ALU 136, allowing simultaneous execution of multiply-accumulate (MAC) and arithmetic operations. The instruction set executable by DSP 130, in this example, includes single-instruction repeat and block repeat operations, block memory move instructions, two and three operand reads, conditional store operations, and parallel load and store operations, as well as dedicated digital signal processing instructions. DSP 130 also includes compare, select, and store unit (CSSU) 142, coupled to data bus E, for accelerating Viterbi computation, as useful in many conventional communication algorithms.

DSP 130 in this example includes significant on-chip memory resources, to which access is controlled by memory/peripheral interface unit 145, via data buses C, D, E, and program bus P. These on-chip memory resources include random access memory (RAM) 144, read-only memory (ROM) 146 used for storage of program instructions, and address registers 148. Program controller and address generator circuitry 149 is also in communication with memory/peripheral interface 145, and receives program instruction code from ROM 146 or from other storage via memory/peripheral interface 145, and generates control signals applied to each of the functional units of DSP 130 to control the execution of instructions corresponding to the received program instruction code. Interface unit 158 is also provided in connection with memory/peripheral interface 145 to control external communications, as do serial and host ports 153. Additional control functions such as timer 151 and JTAG test port 152 are also included in DSP 130.

According to this preferred embodiment of the invention, the various logic functions executed by DSP 130 are effected in a synchronous manner, according to one or more internal system clocks generated by PLL clock generator 150. In this exemplary implementation, PLL clock generator 150 directly or indirectly receives an external clock signal on line REFCLK, such as is generated by other circuitry in the system or by a crystal oscillator or the like, and generates internal system clocks, for example the clock signal on line OUTCLK, communicated (directly or indirectly) to each of the functional components of DSP 130. DSP 130 also includes power distribution circuitry 156 for receiving and distributing the power supply voltage and reference voltage levels throughout DSP 130 in the conventional manner. Other functions, such as JTAG test interface circuitry, built-in self test circuitry, and the like may also be provided in DSP 130, in the conventional manner.

According to the first preferred embodiment of the present invention, DSP 130 is programmed, for example by way of instruction code stored within ROM 146, to execute a syndrome accumulation process upon a stream of encoded data words received by interface unit 158 of DSP 130. In the architecture of DSP 130 as described above and as illustrated in FIG. 5, the execution of this syndrome accumulation instruction code is under the control of program control and address generator 149, which decodes the instructions stored in ROM 146 and which controls execution units such as multiply/add unit 134, accumulators 140, ALU 136, and the like to carry out the instructions upon operands that are stored in accumulators 140, in data registers, or in RAM 144.

It has been observed, according to this first preferred embodiment of the invention, that certain efficiencies in the execution of finite field multiplication are present, when such multiplication is to be performed in the task of syndrome accumulation. Specifically, this preferred embodiment of the invention recognizes that one of the operands used in the conventional syndrome accumulation varies over only a relatively small set of potential values, as will now be described.

For example, in the conventional process illustrated in and described relative to FIG. 3*a*, it has been observed, according to this first preferred embodiment of the invention, that the value of variable $\beta$ does not change within the inner loop of processes 26, 28, and in fact only occupies one of 2t values throughout the entire process (as index i varies from 0 to 2t−1). According to this first preferred embodiment of the invention, 2t syndrome multiplication look-up tables are constructed for use in the inner loop Galois field multiplication process, in place of multiplication process 26 of FIGS. 3*a* and 3*b*, such that the value of variable $\beta$ determines the one of the 2t look-up tables to be used, and such that the value of sum $s_i$ provides the address into this look-up table.

Figure 6:
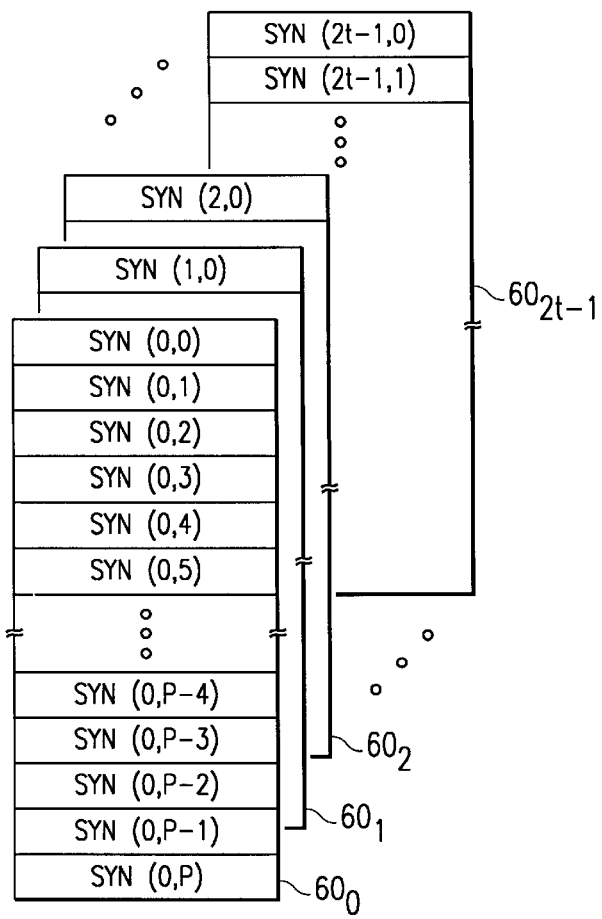
FIG. 6 is a memory map of a portion of the memory of the digital signal processor of FIG. 5 illustrating the arrangement of look-up tables according to the preferred embodiments of the invention.

In the example of DSP 130 of FIG. 5, according to this preferred embodiment of the present invention, these look-up tables are implemented into a portion of RAM 144, arranged as shown in FIG. 6. In this example, look-up tables $60_0$ through $60_{2t-1}$ are provided within RAM 144, each look-up table having P entries SYN(i, j). Entries SYN(i, j) are indexed according to two arguments, the first one of which indicates the one of look-up tables $60_0$ through $60_{2t-1}$ containing the entry, and the second of which indicates the particular entry within the indicated table 60. The first argument i of each entry SYN(i, j) corresponds to the power to which a primitive element $\alpha$ of the finite field is to be raised in the syndrome accumulation process, and as such corresponds to the index of the outer loop of the algorithm of FIG. 3*a*. The second argument j of each entry SYN (i, j) corresponds to one of the possible characters within the finite field being utilized, and thus can vary over P values, placing P entries SYN(i, j) into each of look-up tables $60_0$ through $60_{2t-1}$.

In general, as noted above, the number of look-up tables $60_k$ corresponds to the number of passes through the outer loop which, at most, is twice the number t of correctable errors. The size of each table depends upon the particular finite field arithmetic being utilized. In general, for a finite field alphabet of P characters, each look-up table 60 will have P entries of $\lceil \log_2 P \rceil$ bits each, where $\lceil \ \rceil$ represents the ceiling function (i.e., $\lceil x \rceil$ returns the smallest integer y such that $y \geq x$). For the case of Galois field 256 arithmetic (P=256), each look-up table 60 contains 256 entries SYN(i, j) of eight bits (one byte) each. In the example of (204,188,8) Reed-Solomon code, 2t equals sixteen. The total memory requirement for look-up tables $60_0$ through $60_{2t-1}$ in this example is thus 4 kbytes (16×256×one byte).

The contents of each entry SYN(i, j) corresponds to the desired finite field multiplication. For syndrome accumulation, the desired multiplication is of a first multiplicand corresponding to a primitive element of the finite field raised to the $i^{th}$ power by a Galois field character equal to the value of the particular sum $s_i$ at that point in the process (see FIG. 3a). Accordingly, the contents of each entry SYN(i, j) are defined as:

$$[SYN(i, j)]=GF\_mult(\alpha^i, s_i(j)), \text{ for } 0 \leq i < 2t, \text{ and } 0 \leq j < P$$

where $s_i(j)$ is the $j^{th}$ sum $s_i$ within the inner loop of the syndrome acumulation alphabet.

In the implementation of the look-up tables 60, it is contemplated to be cumbersome to use the Galois field characters directly as part of the address into RAM 144 to locate the particular desired entry SYN(i, j). It is contemplated that some type of address translation from the Galois field value into memory addresses will be utilized, such address translation typically present in some form in conventional programmable logic devices such as DSPs and microprocessors.

The operation of this first preferred embodiment of the invention will now be described in detail, relative to an example of syndrome accumulation as performed in (204, 188, 8) Reed-Solomon decoding. It is contemplated that those of ordinary skill in the art having reference to this specification will be readily able to code the operation of this preferred embodiment of the invention into a sequence of executable instructions compatible with the particular architecture and instruction set of such DSP or microprocessor that may have been selected for use in a specific application, without undue experimentation being required.

According to this first embodiment of the invention, the contents of look-up tables $60_0$ through $60_{2t-1}$ are first stored into memory. It is contemplated that the generation of these look-up tables will be effected by storing a previously determined set of values into RAM 144, given that the syndrome accumulation operation (as well as other operations in the Reed-Solomon decoding operation) is likely to be in the critical path of the computations being carried out, in which case the use of high-speed RAM for storing of these values is preferred. For example, initialization of DSP 130 may include the selection of the particular Reed-Solomon decoding scheme, as well as the retrieval of the appropriate Galois field multiplication results from fixed storage such as ROM 146 or from external storage such as a disk drive, and their storage into RAM 144 in the appropriate entries SYN(i, j) of look-up tables $60_0$ trough $60_{2t-1}$. The values that are pre-stored into look-up tables $60_0$ through $60_{2t-1}$ of course correspond, for each entry SYN(i, j), to the correct results of Galois field multiplication of the corresponding values of indices $\alpha^i$ and j, where $\alpha$ is a selected primitive element of the Galois field. A preferred primitive according to this preferred embodiment of the invention is $\alpha=2$.

Figure 7:
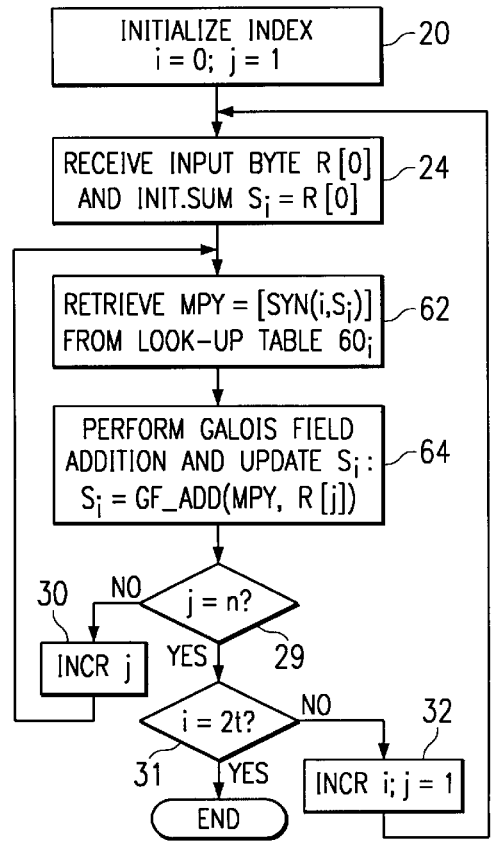
FIG. 7 is a flow chart illustrating the operation of a syndrome accumulation procedure according to a first preferred embodiment of the invention.

FIG. 7 illustrates the operation of DSP 130 in carrying out syndrome accumulation according to this first preferred embodiment of the invention, once look-up tables 60 are established. In FIG. 7, the same reference numerals as used in FIG. 3a are used to refer to similar processes in this first preferred embodiment of the invention. The method of operation begins again with process 20, in which DSP 130 initializes outer loop index i to zero and inner loop index j to 1. In process 24, the first input byte R[0] is received, to which the value of sum $s_i$ is initialized. Sum $s_i$ is an iteratively updated value that, upon completion of the processing for its associated value of index i, corresponds to the ith order coefficient of the syndrome polynomial.

According to the first embodiment of the present invention, Galois field multiplication process 62 is next performed by DSP 130, by accessing the appropriate ones of look-up tables $60_0$ through $60_{2t-1}$. The specific entry SYN(i, j) containing the desired multiplication result (MPY) is selected by using the current value of sum $s_i$ (in this $j^{th}$ pass through process 62) as the index j; in other words, process 62 retrieves the contents of entry SYN(i, $s_i$). In this first pass, where index i=0 and where sum $s_i$ has been initialized to the first input byte R[0], look-up table $60_0$ will contain the desired value at the entry SYN(0, R[0]).

Once the value MPY has been retrieved in look-up table retrieval process 62, DSP 130 next performs Galois field addition process 64 to update the value of sum $s_i$. Specifically, DSP 130 performs a Galois field addition of the value of MPY and the current ($j^{th}$) input byte R[j], in process 64. Following addition 64, the values of the indices i, j are tested against their corresponding limits n (the number of bytes in a message frame) and 2t (twice the number t of errors that may be corrected by the Reed-Solomon process), in the manner described above relative to FIG. 3a. If index j is not yet equal to limit n (decision 29 is NO), index j is incremented in process 30 and control is passed to process 26 to repeat look-up table retrieval process 62, with the new value of sum $s_i$, followed by the Galois field addition of process 64 with the next input byte. Upon index j reaching limit n as determined by decision 29, the determination of syndrome polynomial coefficient $s_i$ is complete; this value of coefficient $s_i$ is then stored in memory, such as RAM 144, and the value of index i is tested against its limit 2t in decision 31. If index i does not yet equal limit 2t (decision 31 is NO), process 32 is performed to increment index i and to reset index j to 1, and control passes back to process 24 for retrieval of the lowest order input value R[0] from which the process is repeated. Upon index i reaching its limit 2t (decision 31 is YES), the syndrome accumulation process is complete. The sequence of syndrome polynomial coefficients $s_i$ are then forwarded to the Euclidean array process, for the continuation of Reed-Solomon decoding as described above relative to FIG. 2.

According to this first preferred embodiment of the present invention, only a single look-up table access is performed by process 62 to execute a Galois field multiplication, thus greatly improving the speed with which syndrome accumulation may be performed by conventional programmable logic devices such as a DSP or microprocessor. This performance improvement is obtained at a reasonable memory cost, considering the relatively modest memory requirements necessary for storage of the 2t look-up tables. As noted in the above example of Galois field 256 arithmetic, where the number t of correctable errors is eight, look-up tables 60 may be realized in 4 kbytes of memory.

According to alternative implementations of this first preferred embodiment of the invention, further efficiency may be obtained by eliminating some of look-up tables $60_0$ through $60_{2t-1}$; for those values of index i for which the corresponding look-up table $60_i$ is omitted, DSP 130 will explicitly carry out the Galois field multiplication. This alternative implementation will, of course, eliminate only those look-up tables $60_i$ that are associated with trivial Galois field multiplications. For example, look-up table $60_0$ (i=0) may be omitted by considering that $\alpha^0=1$ (and thus the Galois field multiplication returns simply the identity of the other multiplicand); similarly, look-up table $60_1$ may be omitted by executing the left-shift and AND/OR operations necessary to perform a Galois field multiplication by $\beta=\alpha^1=2$. These alternative implementations may be most appropriate for certain DSP architectures in which execution time may be bound by the circuitry used to access RAM 144 (e.g., load/store units), examples of such architectures contemplated to include those of the Very Long Instruction Word (VLIW) type.

According to a second preferred embodiment of the present invention, DSP 130 is programmed, for example by way of instruction code, to execute a Chien search process upon a stream of polynomial terms generated by a Euclidean array operation. As in the case of the first embodiment of the invention, it is contemplated that the program code for the Chien search operation according to this second embodiment of the invention will be stored within ROM 146 and executed by DSP 130 under the control of program control and address generator 149.

According to this second preferred embodiment of the invention, the Chien search process is carried out by a somewhat different form of exhaustive polynomial evaluation from that described above relative to FIG. 4. As described above, conventional Chien search operations iterate over the solution set $\{1, 2, \ldots P-1\}$. According to this second preferred embodiment of the present invention, however, the exhaustive polynomial evaluation is performed by iterating over the Galois field character set $\alpha^i$, where i=0, 1, 2, ..., P-2, which necessarily covers the solution set $\{1, 2, \ldots, P-1\}$. According to this approach, the terms $\lambda_i$ are evaluated as follows:

$$\lambda_i = \Lambda(\alpha^i) = \Lambda_0 + \sum_{j=1}^{D} \Lambda_j \alpha^{ij}$$

where D is the degree of the polynomial $\Lambda(x)$ generated by the Euclidean array function. For i=0, the polynomial $\lambda_0$ evaluates to:

$$\lambda_0 = \Lambda_0 + \Lambda_1 + \Lambda_2 + \ldots + \Lambda_D$$

Similarly, for i=1:

$$\lambda_1 = \Lambda_0 + \Lambda_1 \alpha^1 + \Lambda_2 \alpha^2 + \ldots + \Lambda_D \alpha^D$$

and for i=2:

$$\lambda_2 = \Lambda_0 + \Lambda_1 \alpha^2 + \Lambda_2 \alpha^4 + \ldots + \Lambda_D \alpha^{2D}$$

and so on for the entire set of values for index i.

A recursive approach can express the evaluation of the terms $\lambda_i$ through use of terms $w_{i,j}$ defined as follows:

$$w_{0,j} = \Lambda_j \text{ for } j=1, \ldots, D$$

$$w_{i,j} = \alpha^j \cdot w_{i-1,j} = \Lambda_j \alpha^{ij} \text{ for } j=1, \ldots, D; i=1, \ldots, P-2$$

One may then express the polynomial terms $\lambda_i$ as follows:

$$\lambda_i = \Lambda(\alpha^i) = \Lambda_0 + \sum_{j=1}^{D} w_{i,j}$$

$$\text{for } i = 0, \ldots, P-2$$

According to this approach, only the generation of the $w_{i,j}$ terms involves a Galois field multiplication, and each instance of this multiplication involves a constant $\alpha^j$ as one of the multiplicands. The index j assumes at most t values (the maximum degree of polynomial $\Lambda(x)$ being the number t of correctable errors), and therefore, according to this second preferred embodiment of the invention, the Galois field multiplication used to generate the $w_{i,j}$ terms is performed by accessing the appropriate one of t look-up tables, one for each possible value of the constant $\alpha^j$.

In general, the look-up tables required for the Galois field multiplication in the Chien search process according to this second embodiment of the invention will require t tables of P entries of $\lceil \log_2 P \rceil$ bits each; in the present example of (204, 188, 8) Reed-Solomon coding, 2 kbytes of memory are required. According to the present invention, however, the contents of the look-up tables necessary for execution of the Galois field multiplications performed in the Chien search operation are identical to a subset of look-up tables 60 as used in syndrome accumulation according to the first preferred embodiment of the invention. This is because, of course, the values of constants $\alpha^i$ for index i between 1 and t (inclusive) are simply a subset of those values for index i between 0 and 2t−1, and also because each of look-up tables $60_0$ through $60_{2t-1}$ contain an entry SYN(i, j) for each of the P members of the finite field. In the example of FIG. 6, therefore, look-up tables $60_1$ through $60_t$ may be used in the Galois field multiplication performed in the Chien search process according to this second preferred embodiment of the invention. Accordingly, if DSP 130 is programmed to perform the syndrome accumulation according to the first preferred embodiment of the present invention, the implementation of the look-up tables for performing the Chien search process according to the second preferred embodiment of the present invention does not require additional circuitry or memory resources.

Figure 8:
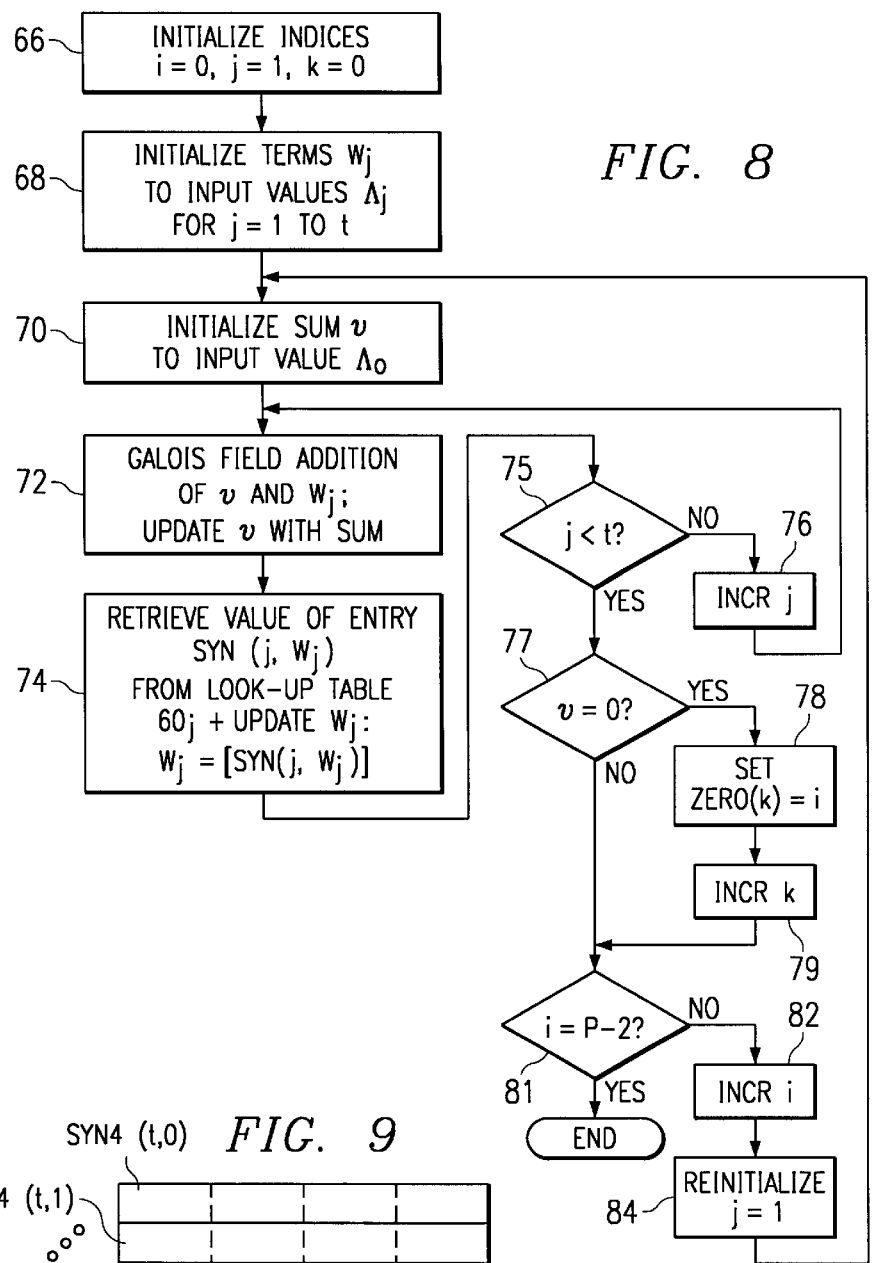
FIG. 8 is a flow chart illustrating the operation of a Chien search procedure according to a second preferred embodiment of the invention.

The Chien search method according to this second preferred embodiment of the invention will now be described in detail relative to FIG. 8. As in the case of the syndrome accumulation process according to the first embodiment of the invention described hereinabove, the contents of entries SYN(i, j) of look-up tables $60_1$ through $60_T$ (e.g., in RAM 144) have been written with the appropriate values for the Galois field multiplication results corresponding to their particular indices i, j. The Chien search operation then begins with process 66, in which DSP 130 initializes outer loop index i to 0, inner loop index j to 1, and index k to zero. In process 68, DSP 130 then initializes the first instance of t terms $w_j$ (for each value of j from 1 to t) with an input value from a corresponding term of the polynomial $\Lambda_j(x)$ generated by the Euclidean array function, such that each term $w_j = \Lambda_j$.

The outer loop of the Chien search operation then begins with process 70, in which the value of sum υ is initialized to input value $\Lambda_0$. DSP 130 then, in process 72, updates the sum value u by performing a Galois field addition of the current value of υ with the $j^{th}$ term $w_j$. In this first pass through the inner loop, index j=1 and index i=0, and as such the Galois field addition of process 72 effectively performs a Galois field addition of input value $\Lambda_0$ and input value $\Lambda_1$. This addition corresponds to the generation of polynomial term $\lambda_0$ as the sum of the input values $\Lambda$, as noted above.

Following the addition of process 72, DSP 130 next prepares the term $w_j$ for the next pass through the outer loop (i.e., in the determination of polynomial term $\lambda_1$ in this first instance, or $\lambda_{i+1}$ generally), in process 74. Process 74 corresponds to the Galois field multiplication of the current value of term $w_j$ by an iterating power of a primitive Galois field element $\alpha$. According to this second preferred embodiment of the invention, DSP 130 performs this Galois field operation by accessing a selected one of look-up tables $60_1$ through $60_T$ specified by the current value of the index j, to retrieve the contents of an entry therein corresponding to the current value of the term $w_j$. Specifically, the contents of entry SYN(j, $w_j$) of look-up table $60_j$ are retrieved in process 64, and these contents are stored into memory at the location corresponding to term $w_j$. This look-up table operation corresponds to multiplying the current value of term $w_j$ by the $j^{th}$ power of the Galois field primitive $\alpha$, so that the Galois field addition in the next instance of the inner loop process 72 may simply add this term $w_j$ to the then-current value of sum $\upsilon$. Decision 75 is then performed by DSP 130 to determine if processes 72, 74 have been performed for the t iterations necessary in the evaluation of sum $\upsilon$; if not (decision 75 is NO), index j is incremented in process 76 and processes 72, 74 are repeated for the incremented value of index j.

Upon completion of the t iterations of the inner loop (decision 75 is YES), DSP 130 compares the value of sum $\upsilon$ against zero, in decision 77, to determine if a root of the polynomial $\Lambda(x)$ has been found. If so (decision 77 is YES), process 78 sets the value of zero array element zero(k) to the current value of index i, and the element index k is incremented in process 79. If a root was not found (decision 77 is NO) or upon completion of process 79, index i is compared against its terminal value P−1 in decision 81. If additional passes through the outer loop are necessary (i.e.,. if the entire Galois field alphabet has not yet been analyzed), as indicated by decision 81 being NO, index i is incremented in process 82, index j is reset to 1 in process 84, and control passes back to process 70 to again initialize the sum u and begin the next evaluation process. Upon index i being at its terminal value of P−1 (decision 81 is YES), the process is complete. The value of the roots stored in array zero(k), and their order (i.e., index values i) that have been identified by the Chien search procedure are then used, for example by Forney unit 18 and input ring buffer 19 of the conventional operation illustrated in FIG. 2, to identify the magnitude and position of the errors so detected, in the conventional Reed-Solomon decoding manner.

According to this second embodiment of the present invention, the Galois field multiplication that is conventionally performed in software realizations of the Chien search procedure is replaced by a single table look-up operation, thus greatly reducing the computation time required for this process. In addition, considering that the memory requirements for the necessary look-up tables are quite modest, and especially considering that the same tables may be used in the Chien search operation as are used in syndrome accumulation according to the first embodiment of the present invention, this significant and noticeable performance improvement is obtained at very little cost in terms of memory resource consumption.

Furthermore, the Chien search procedure according to this second embodiment of the invention is quite flexible as the contents of the look-up tables 60 do not depend upon the number t of correctable errors. Accordingly, the present invention is particularly beneficial in those applications, such as in asymmetric digital subscriber line (ADSL) modems, in which the value of t may change "on-the-fly", as the contents of the look-up tables need not be overwritten in order to accommodate such a change. In such an application, it is preferred to establish a number of look-up tables that can contemplate the maximum value of t (or 2t−1, if the look-up tables are used for syndrome accumulation as well), so that a lower t may be implemented simply by decoding into a subset of the look-up tables.

According to a third preferred embodiment of the present invention, the Chien search procedure may be further accelerated in DSPs or microprocessors having wide data paths, such that multiple polynomial evaluations may be carried out in parallel, as multiple threads. The optimal number of threads will depend upon the architecture of the DSP or microprocessor, specifically the memory cost constraint and the particular instruction set, in combination with the parameters of the Reed-Solomon coding. For the example of (204, 188, 8) Reed-Solomon coding, where each symbol is eight bits long, a DSP or microprocessor with 32-bit data buses and 32-bit registers, and capable of executing 32-bit load and XOR operations, may readily execute four threads in parallel, where each "thread" corresponds to one of the outer loop iterations. Specifically, as will now be described in detail relative to this third preferred embodiment of the invention, the evaluation of polynomials corresponding to index i values from 1 through 4 is performed simultaneously, followed by the evaluations corresponding to index i values from 5 through 8, and so on.

Figure 9:
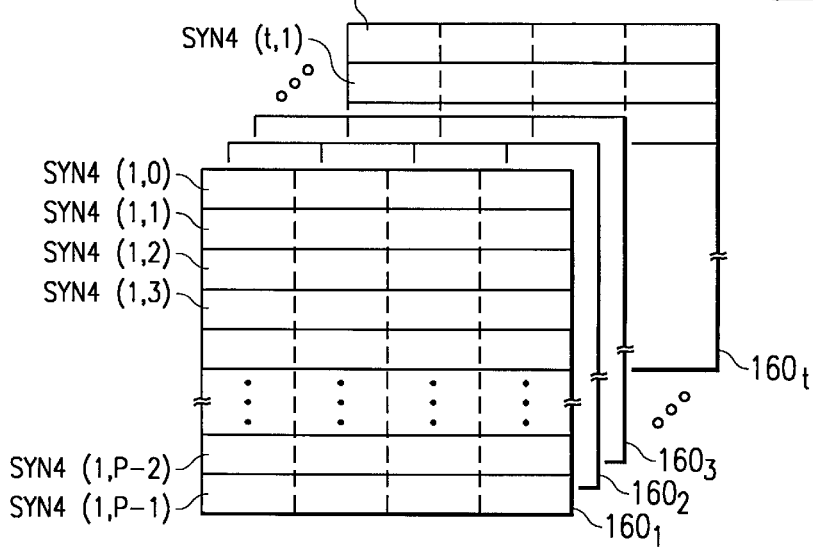
FIG. 9 is a memory map of a portion of the memory of the digital signal processor of FIG. 5 illustrating the arrangement of look-up tables according to the third preferred embodiment of the invention.
Figure 10:
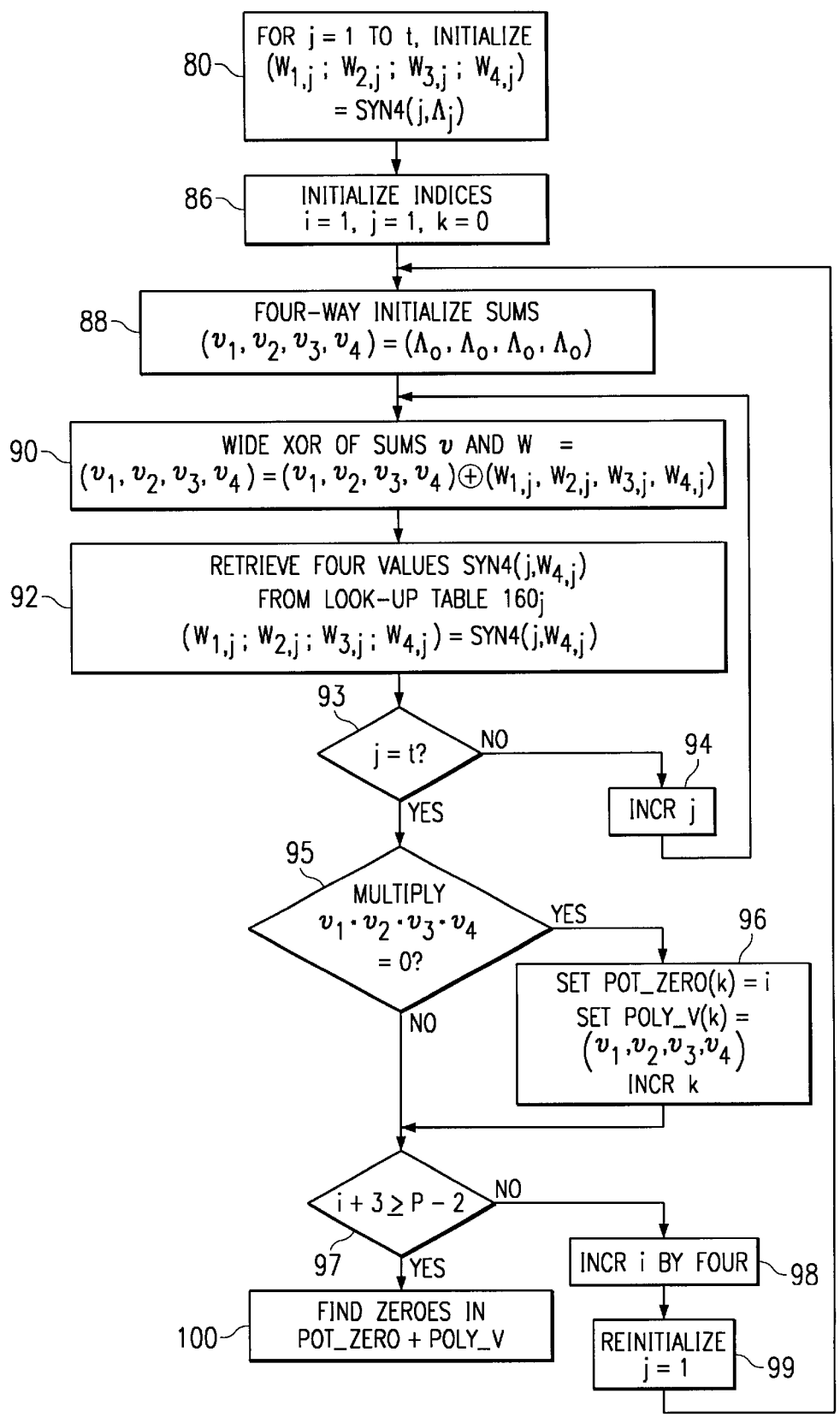
FIG. 10 is a flow chart illustrating the operation of a Chien search procedure according to a third preferred embodiment of the invention.

The operation of this third preferred embodiment of the present invention will now be described in detail. According to this third preferred embodiment of the invention, differently organized look-up tables $160_1$ through $160_t$, from tables 60 described hereinabove, are preferably used, as will now be described relative to FIG. 9. According to this embodiment of the invention, each entry SYN4(i, j) of one of look-up tables 160 includes four values; for the example of eight-bit Galois field (GF 256) arithmetic, each entry SYN4(i, j) is four bytes wide, and includes the four values:

$$SYN4(i,j)=(j\cdot\alpha^i, j\cdot\alpha^{2i}, j\cdot\alpha^{3i}, j\cdot\alpha^{4i})$$

where index i ranges from 1 to t, and where index j ranges from 0 to P−1. This arrangement of look-up tables $160_0$ through $160_t$ is preferred according to this third embodiment of the invention for most architectures having a 32-bit data bus, as the smaller look-up table arrangement of FIG. 6 may involve four memory accesses to retrieve the four thread values, rather than a single memory access as may be performed if RAM 144 is arranged to include look-up tables 160 of FIG. 9. Look-up tables $160_1$ through $160_t$ are first written with the appropriate Galois field multiplication results corresponding to their indices (i, j), as before, prior to initiation of the Chien search procedure, as will now be described relative to FIG. 10.

The Chien search procedure according to this third embodiment of the invention begins with process 80, in which array variables $w_{1,j}, w_{2,j}, w_{3,j}, w_{4,j}$ are initialized for each value of j from 1 to t. These initial values of array variables w for the parallel threads are generated by the Galois field product of input polynomial term $\Lambda_j$ from the Euclidean array process with the Galois field primitive $\alpha$ raised to the power j times 1 through 4, respectively:

$$(w_{1,j},w_{2,j},w_{3,j},w_{4,j})=(\Lambda_j\cdot\alpha^j,\Lambda_j\cdot\alpha^{2j},\Lambda_j\cdot\alpha^{3j},\Lambda_j\cdot\alpha^{4j})=SYN4(j,\Lambda_j)$$

These Galois field multiplications, numbering 4t, may be expressly performed by DSP 130 considering that their number is small. Preferably, however, these multiplications are performed by accessing look-up tables $160_1$ through $160_t$ to retrieve the contents of SYN4(1, $\Lambda_1$) through SYN4(t, $\Lambda_t$), respectively. As such, process 80 may readily be performed by t accesses to look-up tables 160. Process 86 is next performed by DSP 130 to initialize indices i and j to the value 1, and result index k to zero.

Since four sums 98 (i.e., four outer loops) are being performed in parallel according to this third embodiment of the invention, process 88 is next performed by DSP 130 to initialize a data word with four sums $\upsilon_1$ through $\upsilon_4$ with the value of polynomial term $\Lambda_0$. These sums $\upsilon_1$ through $\upsilon_4$ will be re-used (i.e., overwritten) in each loop through the process, to conserve memory. In process 90, DSP 130 next performs a four-byte wide exclusive-OR (XOR) operation of sums $\upsilon_1$ through $\upsilon_4$ with their corresponding array variables $w_{1,j}$ through $w_{4,j}$ using 32-bit ALU 136 (see FIG. 5). The values of sums $\upsilon_1$ through $\upsilon_4$ produced in process 90 will be tested to determine if a root is present therein, as will be described below.

Process 92 is then performed to generate Galois field multiplication products for the array variables $w_{1,j}$ through $w_{4,j}$ in preparation for the next pass of the outer loop of the Chien search procedure. The Galois field multiplication overwrites the four values of array variables $w_{1,j}$ through $w_{4,j}$ as follows:

$$(w_{1,j}, w_{2,j}, w_{3,j}, w_{4,j}) = (w_{1,j} \cdot \alpha^j, w_{2,j} \cdot \alpha^{2j}, w_{3,j} \cdot \alpha^{3j}, w_{4,j} \cdot \alpha^{4j})$$

According to this third preferred embodiment of the invention, process 92 is carried out by accessing look-up table 160$_j$ to retrieve the contents of entry SYN4(j, $w_{4,j}$) therefrom. To conserve memory, these four values (each one byte in size) are then stored in the previous memory locations of array variables ($w_{1,j}$, $w_{2,j}$, $w_{3,j}$, $w_{4,j}$) for use in the next pass of processes 90, 92. Decision 93 compares index j against its limit t to determine whether such additional passes are to be performed (decision 93 is YES), in which case index j is incremented in process 94 and processes 90, 92 are then repeated.

Upon completion of processes 90, 92 for the t passes therethrough, the values of sums $\upsilon_1$ through $\upsilon_4$ correspond to four evaluations of the polynomial that may be interrogated to determine if any roots are present. Decision 95 is carried out by DSP 130, specifically ALU 136 therein, by performing an arithmetic multiplication of these sums $\upsilon_1$ through $\upsilon_4$ with one another and comparing the result to zero (a non-zero result indicating that none of the sums $\upsilon_1$ through $\upsilon_4$ constitutes a root of the Euclidean polynomial $\Lambda(x)$). In the event that a potential root is contained within sums $\upsilon_1$ through $\upsilon_4$ (decision 95 is YES), process 96 is performed by DSP 130 to set the $k^{th}$ location in a memory array pot_zero to the current value of outer loop index i, and to set the $k^{th}$ word in array poly_v to the current values of sums $\upsilon_4$ through $\upsilon_4$. Arrays pot_zero and poly_v are used in a post-processing operation, according to this third embodiment of the present invention, from which the specific roots and their locations are then identified. Result index k (used to identify the location of arrays pot_zero and poly_v) is then incremented in process 96.

If no potential roots are contained within sums $\upsilon_1$ through $\upsilon_4$ (decision 95 is NO) or upon completion of process 96, outer loop index i plus 3 (corresponding to the fourth parallel thread then completed, in this example) is then compared against limit P–2 in decision 97 to determine if the Chien search procedure is complete. If not (decision 97 is NO), process 98 increments outer loop index i by four (since four outer loop threads are being processed in parallel in this example), and index j is reset to 1 in process 99; control then passes to process 88 in which sums $\upsilon_1$ through $\upsilon_4$ are reinitialized and the inner loops are again repeated. for index j from 1 to t. Upon decision 97 returning a YES to indicate that the current Chien search evaluations are complete, process 100 is then performed by DSP 130 to interrogate arrays pot_zero and poly_v to specifically identify the roots of the Euclidean polynomial $\Lambda(x)$ as found by the Chien search procedure. At this point, it is also preferred to check the i=0 case $$\left( \Lambda_0 \sum_{j=0}^{t} \Lambda_0 \right)$$

One can rely upon the limit t of correctable errors to bound the post-processing of process 100, as at most 4t bytes of array poly_v need be interrogated at this point. The values of the roots identified by this post-processing of arrays pot_zero and poly_v are the output of the Chien search procedure, which are then used, for example by Forney unit 18 and input ring buffer 19 of the conventional operation illustrated in FIG. 2, to identify the magnitude and position of the errors so detected, in the conventional Reed-Solomon decoding manner. Upon completion of process 100, error correction is then executed by the remainder of the Reed-Solomon decoding process, in the conventional manner.

Those in the art having reference to this description of the third embodiment of the invention will recognize that alternative implementations may be utilized, depending upon the particular architecture. Of course, one such alternative implementation will vary the number of parallel threads from four, as described above, to fewer or more such threads, depending upon the particular Reed-Solomon coding scheme and the architecture of the particular DSP or microprocessor carrying out the procedure. Additionally, the post-processing of process 100 may be incorporated into the main loop, if desired.

The Chien search procedure according to this third preferred embodiment of the present invention is contemplated to be even more computationally efficient than the single thread approach described above relative to FIG. 7, for processor architectures of 32-bit and 64-bit data paths, particularly if eight-bit finite field values are used in the Reed-Solomon coding. However, this improved performance will require larger look-up tables, specifically M times the size of those used in the single-thread approach (for M parallel threads); in addition, the syndrome accumulation look-up tables cannot be fully shared by the Chien search of this third embodiment of the invention.

Figure 11:
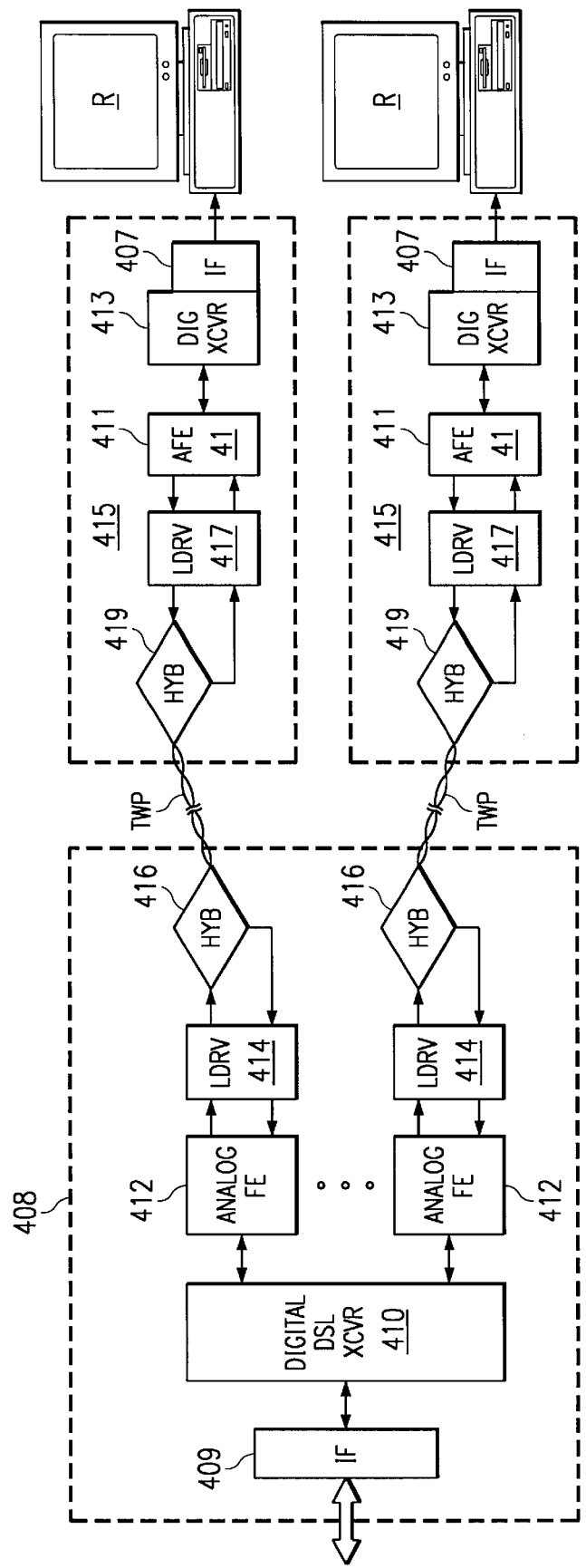
FIG. 11 is an electrical diagram, in block form, of a digital subscriber line (DSL) communication system into which the preferred embodiments of the invention may be implemented.

Referring now to FIG. 11, an example of an electronic system into which the present invention may be beneficially implemented will now be described by way of example; this exemplary system corresponds to digital subscriber line (DSL) modems, particularly those of the asynchronous type (i.e., ADSL modems), in which the modem at the remote user differs from that at the telephone system central office. As communications carried out by modems over telephone lines typically involves Reed-Solomon decoding, it is contemplated that the present invention will be particularly beneficial in this application. As such, FIG. 11 illustrates an example of such an application, in which DSP 130 as described above is included within digital subscriber line (DSL) modems in a telecommunications system.

FIG. 11 illustrates a typical system installation of DSL services, in which multiple remote subscribers interface with a telephone system central office. In this example, a user in a home or office environment operates remote computer system R, such as a personal computer or workstation, or alternatively an entertainment unit in the video-on-demand (VOD) context. Each of remote computer systems R serves as a remote source and destination of communicated data, which may be representative of text, graphics, motion pictures, audio, etc. Each remote system R is associated with a remote DSL modem 415, by way of which the remote system R communicates with central office DSM modem 408 over a conventional twisted-pair telephone facility TWP. One or more telephones (not shown) may also be connected into each twisted pair wire facility TWP, such that "Plain Old Telephone Service" (POTS) voice communications may alternatively or additionally be communicated over twisted pair wire facility TWP. The DSL technology in the specific example of FIG. 11 may be of the asymmetric type (i.e., ADSL), with traffic traveling from central office modem 408 to remote modems 415 at a signal bandwidth that is higher in frequency than that of traffic traveling from remote modems 415 to central office modem 408 (i.e., upstream).

As illustrated in FIG. 11, each of twisted pair wire facilities TWP is received by central office DSL modem 408, which is contemplated to be located in a central office of the local or long distance telephone service provider. Central office modem 408, in this example, is capable of receiving multiple twisted pair wire facilities TWP (only two of which are illustrated in this example). Central office modem 408 provides communication of data between twisted pair wire facilities TWP, and thus remote systems R, and a host computer (not shown in FIG. 11) which serves as the source or destination of data, or as an intermediate gateway to a network, such as the Internet, or a dedicated "dial-up" content provider or network. Of course, the central office will typically also include switchgear for the routing of calls such as those placed by remote systems R (or associated telephones) over twisted pair wire facilities TWP. As noted above, central office modem 408 will likely be connected to a backbone network, which in turn is in communication with other communication paths by way of equipment such as routers or Digital Subscriber Line Access Multiplexers (DSLAMs). In the application where POTS service overlays the ADSL data traffic, such equipment may also include some type of "splitter" for separating POTS from the data traffic, routing the POTS traffic to the conventional telephone network (PSTN) and routing the data to a wide-area network (WAN).

In the example of FIG. 11, remote DSL modems 415 are each arranged as a plurality of functions, which roughly correspond to individual integrated circuits in this exemplary embodiment of the invention. It is of course to be understood that the particular integrated circuit, or "chip", boundaries among these various functions may vary among implementations; the exemplar y realization illustrated in FIG. 11 is provided by way of example only. In this example, each of remote DSL modems 415 include a host interface 407, for interfacing digital transceiver function 413 with its associated remote system R. Host interface 407 is of conventional construction for such interface functions, an example of which is the TNETD2100 digital serial bus interface circuit available from Texas Instruments Incorporated.

According to this embodiment of the invention, digital transceiver function 413 in remote DSL modems 415 is a programmable device for executing the necessary digital processing operations for both transmission and receipt of the data payload. These operations include such functions as formatting of the digital data from the host computer system (into packets and frames, for example), encoding of the data into appropriate subchannels for transmission, and performing an inverse Fast Fourier Transform (IFFT) to transform the encoded data into time domain signals; on the receive side, digital transceiver function 413 performs the reverse of these operations, as well as echo cancellation processing. Particularly at the data rates discussed hereinabove, the digital data processing capacity and power of digital transceiver function 413 is preferably of a high level, preferably with capability on the order of that provided as digital signal processors of the TMS320C6x type available from Texas Instruments Incorporated. According to the preferred embodiment of the invention, digital transceiver function 413 is implemented by way of a programmable integrated circuit, such as DSP 130 described hereinabove, including the look-up tables and program code to carry out the important Reed-Solomon decoding operations of syndrome accumulation and Chien searching in an efficient manner, as described above relative to the preferred embodiments of the invention, under the control of instructions in the instruction set. The Reed-Solomon decoding operation carried out by digital transceiver function 413 is applied to encoded signals that are communicated over its associated twisted pair facility TWP from central office modem 408, and which are processed through hybrid 419, line driver 415, and AFE 411, so as to be received by digital transceiver function 413 in digital form. Following the Reed-Solomon decoding operation carried out by way of digital transceiver function 413, implemented as DSP 130 according to the preferred embodiment of the invention, the decoded digital signals are then communicated to remote system R via interface 407.

Each digital transceiver function 413 is bidirectionally connected to AFE 411, which is a mixed-signal (i.e., involving both digital and analog operations) integrated circuit which provides all loop interface components necessary for DSL communications other than those which involve high voltages. In this regard, AFEs 411 in each of remote DSL modems 415 perform both transmit and receive interface functions. In turn, AFEs 411 in each of remote modems 415 bidirectionally interface with line driver 417, which is a high-speed line driver and receiver for driving and receiving the ADSL signals on twisted pair facility TWP, such as the THS6002 line driver available from Texas Instruments Incorporated. Line drivers 417 in remote modems 415 are connected to a four-wire to two-wire "hybrid" integrated circuit 419, which converts the dedicated transmit and receive lines from line driver 417 to the two-wire arrangement of twisted pair facility TWP, in full-duplex fashion.

In the central office, central office DSL modem 408 includes host interface 409, which connects modem 408 to a host computer (not shown). Host interface 409 may, as noted above, be implemented by conventional circuitry such as the TNETD2100 digital serial bus interface circuit available from Texas Instruments Incorporated. As noted above, the host computer will interface central office modem 408 to a splitter for separating POTS from the data traffic, as noted above, and thus to the conventional telephone network (PSTN) and wide-area network (WAN) as appropriate for the service being provided. Central office modem 408 includes digital DSL transceiver function 410, which connects to multiple analog front end functions (AFEs) 412 as shown in FIG. 11. As in the case of remote DSL modems 415, AFEs 412 provide all loop interface components necessary for DSL communications other than those which involve high voltages, for both transmit and receive interface functions.

Digital transceiver function 410 is similarly constructed as and performs similar processing to digital transceiver functions 413 in remote DSL modems 415, with certain differences in function arising from the different frequencies of its received and transmitted traffic. As before, digital transceiver function 410 is preferably implemented as a high-performance digital signal processor, such as DSP 130 described hereinabove, so that Reed-Solomon decoding may be efficiently carried out thereby. As in the case of remote DSL modems 415, such DSP implementation includes the provision of look-up tables and program code so that the important Reed-Solomon decoding operations of syndrome accumulation and Chien searching are carried out in an efficient manner as described above relative to the preferred embodiments of the invention, under the control of instructions in the instruction set of DSP 130. The Reed-Solomon decoding operation carried out by digital transceiver function 410, implemented as DSP 130 according to the preferred embodiment of the invention, is applied to encoded signals that are communicated over its associated twisted pair facility TWP from remote modem 415, after processing via hybrid 416, line driver 414, and AFE 412. Following the Reed-Solomon decoding operation carried out by way of digital transceiver function 410, implemented as DSP 130 according to the preferred embodiment of the invention, the decoded digital signals are then communicated to the central office host computer via interface 409.

The advantages of the present invention as obtained in the DSL modem application are also, as noted above, useful in many other applications in which Reed-Solomon or similar decoding is required. The DSL modem implementation shown in FIG. 11 and described hereinabove is provided by way of example only. Examples of such other implementations include cable modems, set-top boxes for the receipt and decoding of digital video, disk drive communications within computers, other types of network communications among computer workstations, and the like.

The present invention has been observed to greatly improve the efficiency of the Reed-Solomon decoding process as implemented as software for programmable logic devices such as DSPs or microprocessors, whether as higher level language code (e.g., C, C++) or as processor-specific assembly language code. Conventional syndrome accumulation and Chien search routines have been observed to occupy up to as much as 80% of the processing time in a fully C-coded Reed-Solomon decoding program; according to the present invention, the processing time required to perform these procedures has been reduced by at least an order of magnitude, without excessively expanding the memory resources required for implementation. It is therefore contemplated that the present invention will be beneficial in many applications, and will assist in improving the capability of Reed-Solomon error correction while still maintaining the decoding process as a real-time operation.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A method of operating a programmable logic device to perform syndrome accumulation according to a Reed-Solomon coding protocol to produce a syndrome polynomial from an input frame sequence of digital values, comprising the steps of:

arranging a plurality of look-up tables in a memory, each of the plurality of look-up tables associated with one of a plurality of power index values, each of the plurality of look-up tables having one entry associated with each of a plurality of members of a finite field, each entry containing a finite field value corresponding to the finite field product of the associated finite field member and a finite field primitive raised to a power corresponding to the associated power index value of the look-up table; and for each of a plurality of degrees of the syndrome polynomial, generating a syndrome polynomial coefficient by performing the operations of:
   initializing a sum value to a first digital value of the input frame sequence;
   accessing a selected one of the plurality of look-up tables, the selected look-up table corresponding to one of the plurality of power index values, to retrieve therefrom the contents of an entry corresponding to a current value of the sum value;
   performing a finite field addition of the contents retrieved in the accessing step with a next digital value of the input frame sequence;
   updating the sum value to the result of the performing step; and
   repeating the accessing, performing, and updating operations for each of the digital value of the input frame sequence.

2. The method of claim 1, wherein the number of look-up tables is equal to twice the number of correctable errors in the Reed-Solomon coding protocol.

3. The method of claim 1, wherein the step of generating a syndrome polynomial coefficient comprises:
   for at least a lowest order one of the plurality of degrees of the syndrome polynomial, performing a finite field multiplication of the finite field primitive raised to the lowest order with the current value of the sum value.

4. The method of claim 1, wherein the finite field is of the Galois field type.

5. The method of claim 1, wherein the programmable logic device comprises a digital signal processor.

6. A programmable system for performing syndrome accumulation according to a Reed-Solomon coding protocol to produce a syndrome polynomial from an input frame sequence of digital values, comprising:

a read/write memory, having a portion arranged as a plurality of look-up tables in a memory, each of the plurality of look-up tables associated with one of a plurality of power index values, each of the plurality of look-up tables having one entry associated with each of a plurality of members of a finite field, each entry containing a finite field value corresponding to the finite field product of the associated finite field member and a finite field primitive raised to a power corresponding to the associated power index value of the look-up table at least one execution unit coupled to the read/write memory, for executing a sequence of program instructions; and a program memory, coupled to the at least one execution unit, for storing a sequence of program instructions for controlling the operation of the at least one execution unit to generate a sequence of syndrome polynomial coefficients by performing, for each of a plurality of degrees of the syndrome polynomial, the operations of:
   initializing a sum value to a first digital value of the input frame sequence;
   accessing a selected one of the plurality of look-up tables, the selected look-up table corresponding to one of the plurality of power index values, to retrieve therefrom the contents of an entry corresponding to a current value of the sum value;
   performing a finite field addition of the contents retrieved in the accessing step with a next digital value of the input frame sequence;

updating the sum value to the result of the performing step; and repeating the accessing, performing, and updating operations for each of the digital value of the input frame sequence.

7. The programmable system of claim 6, wherein the program memory, read/write memory, and at least one execution unit are implemented in a single integrated circuit.

8. The programmable system of claim 6, wherein the number of look-up tables is equal to twice the number of correctable errors in the Reed-Solomon coding protocol.

9. A method of operating a programmable logic device to perform a Chien search procedure according to a Reed-Solomon coding protocol to identify roots of an input polynomial expressed as a sequence of input polynomial terms, comprising the steps of:

arranging a plurality of look-up tables in a memory, each of the plurality of look-up tables associated with one of a plurality of power index values, each of the plurality of look-up tables having one entry associated with each of a plurality of members of a finite field, each entry containing a finite field value corresponding to the finite field product of the associated finite field member and a finite field primitive raised to a power corresponding to the associated power index value of the look-up table; and for each of a plurality of degrees of the input polynomial, initializing a product term to an input polynomial term of the corresponding degree in the input polynomial; and for each of a plurality of iterations numbering the number of elements in the finite field, less one, generating a sum value by:

initializing the sum value to a lowest order input polynomial term;

initializing a loop index value;

combining the sum value with a current value of the product term associated with the loop index value, and setting the current sum value to the result of the combining;

accessing one of the plurality of look-up tables, the selected look-up table corresponding to the loop index value, to retrieve therefrom the contents of an entry corresponding to a current value of the product term;

updating the current value of the product term associated with the loop index value with the retrieved contents;

incrementing the loop index value;

repeating the combining, accessing, updating, and incrementing steps for a selected number of iterations; and responsive to the sum value to zero, storing a root indicator of the iteration in a memory location, indicating the iteration for which a root of the input polynomial was detected.

10. The method of claim 9, wherein the selected number of iterations corresponds to the number of correctable errors for the Reed-Solomon protocol.

11. The method of claim 9, wherein the number of look-up tables is equal to the number of correctable errors in the Reed-Solomon coding protocol.

12. The method of claim 9, wherein the combining step comprises:

performing a finite field addition the sum value with a current value of the product term associated with the loop index value, and setting the current sum value to the result of the addition.

13. The method of claim 9, wherein the step of generating a sum value is performed simultaneously for a group of the plurality of iterations.

14. The method of claim 13, wherein the plurality of look-up tables are arranged so that each entry contains a group of finite field values, a first one of the group of finite field values corresponding to the finite field product of the associated finite field member and a finite field primitive raised to a power corresponding to the associated power index value of the look-up table, and a second one of the group of finite field values corresponding to the finite field product of the associated finite field member and a finite field primitive raised to twice the power corresponding to the associated power index value of the look-up table.

15. A programmable system for performing a Chien search procedure according to a Reed-Solomon coding protocol to identify roots of an input polynomial expressed as a sequence of input polynomial terms, comprising:

a read/write memory, having a portion arranged as a plurality of look-up tables in a memory, each of the plurality of look-up tables associated with one of a plurality of power index values, each of the plurality of look-up tables having one entry associated with each of a plurality of members of a finite field, each entry containing a finite field value corresponding to the finite field product of the associated finite field member and a finite field primitive raised to a power corresponding to the associated power index value of the look-up table at least one execution unit coupled to the read/write memory, for executing a sequence of program instructions; and a program memory, coupled to the at least one execution unit, for storing a sequence of program instructions for controlling the operation of the at least one execution unit to perform the operations of:

for each of a plurality of degrees of the input polynomial, initializing a product term to an input polynomial term of the corresponding degree in the input polynomial; and for each of a plurality of iterations numbering the number of elements in the finite field, less one, generating a sum value by:

initializing the sum value to a lowest order input polynomial term;

initializing a loop index value;

combining the sum value with a current value of the product term associated with the loop index value, and setting the current sum value to the result of the combining;

accessing one of the plurality of look-up tables, the selected look-up table corresponding to the loop index value, to retrieve therefrom the contents of an entry corresponding to a current value of the product term;

updating the current value of the product term associated with the loop index value with the retrieved contents;

incrementing the loop index value;

repeating the combining, accessing, updating, and incrementing steps for a selected number of iterations; and responsive to the sum value to zero, storing a root indicator of the iteration in a location of read/write memory, indicating the iteration for which a root of the input polynomial was detected.

16. The system of claim 15, wherein the selected number of iterations corresponds to the number of correctable errors for the Reed-Solomon protocol.

17. The system of claim 15, wherein the number of look-up tables is equal to the number of correctable errors in, the Reed-Solomon coding protocol.

18. The system of claim 15, wherein the combining operation comprises:
performing a finite field addition the sum value with a current value of the product term associated with the loop index value, and setting the current sum value to the result of the addition.

19. The system of claim 15, wherein the step of generating a sum value is performed simultaneously for a group of the plurality of iterations.

20. The system of claim 19, wherein the plurality of look-up tables are arranged so that each entry contains a group of finite field values, a first one of the group of finite field values corresponding to the finite field product of the associated finite field member and a finite field primitive raised to a power corresponding to the associated power index value of the look-up table, and a second one of the group of finite field values corresponding to the finite field product of the associated finite field member and a finite field primitive raised to twice the power corresponding to the associated power index value of the look-up table.

21. A method of operating a programmable logic device to perform Reed-Solomon decoding upon an input frame sequence of digital values, comprising the steps of:
arranging a plurality of look-up tables in a memory, each of the plurality of look-up tables associated with one of a plurality of power index values, each of the plurality of look-up tables having one entry associated with each of a plurality of members of a finite field, each entry containing a finite field value corresponding to the finite field product of the associated finite field member and a finite field primitive raised to a power corresponding to the associated power index value of the look-up table; and performing a syndrome accumulation procedure comprising the steps of:
for each of a plurality of degrees of the syndrome polynomial, generating a syndrome polynomial coefficient by performing the operations of:
initializing a sum value to a first digital value of the input frame sequence;
accessing a selected one of the plurality of look-up tables, the selected look-up table corresponding to one of the plurality of power index values, to retrieve therefrom the contents of an entry corresponding to a current value of the sum value;
performing a finite field addition of the contents retrieved in the accessing step with a next digital value of the input frame sequence;
updating the sum value to the result of the performing step; and
repeating the accessing, performing, and updating operations for each of the digital value of the input frame sequence;
performing a Euclidean array function upon the syndrome polynomial coefficients;
then performing a Chien search procedure according to the Reed-Solomon coding protocol to identify roots of an input polynomial expressed as a sequence of input polynomial terms, comprising the steps of:
for each of a plurality of degrees of the input polynomial, initializing a product term to an input polynomial term of the corresponding degree in the input polynomial; and
for each of a plurality of iterations numbering the number of elements in the finite field, less one, generating a sum value by:
initializing the sum value to a lowest order input polynomial term;
initializing a loop index value;
combining the sum value with a current value of the product term associated with the loop index value, and setting the current sum value to the result of the combining;
accessing one of the plurality of look-up tables, the selected look-up table corresponding to the loop index value, to retrieve therefrom the contents of an entry corresponding to a current value of the product term;
updating the current value of the product term associated with the loop index value with the retrieved contents;
incrementing the loop index value;
repeating the combining, accessing, updating, and incrementing steps for a selected number of iterations; and
responsive to the sum value to zero, storing a root indicator of the iteration in a memory location, indicating the iteration for which a root of the input polynomial was detected; and
then using the identified roots of the Chien search procedure to correct errors in the digital values of the input frame sequence.

* * * * *